United States Patent
Wakao

(10) Patent No.: US 9,664,241 B2
(45) Date of Patent: May 30, 2017

(54) ELECTRICAL LOAD CONTROL DEVICE, ABNORMALITY DETERMINATION METHOD, AND ABNORMALITY DETERMINATION PROGRAM

(71) Applicant: JTEKT Corporation, Osaka-shi (JP)

(72) Inventor: Hisaaki Wakao, Okazaki (JP)

(73) Assignee: JTEKT CORPORATION, Osaka-shi (JP)

(*) Notice: Subject to any disclaimer, the term of this patent is extended or adjusted under 35 U.S.C. 154(b) by 169 days.

(21) Appl. No.: 14/222,804

(22) Filed: Mar. 24, 2014

(65) Prior Publication Data
US 2014/0297144 A1    Oct. 2, 2014

(30) Foreign Application Priority Data
Mar. 27, 2013   (JP) ................. 2013-066611

(51) Int. Cl.
*F16D 48/06*  (2006.01)
*B60W 50/02*  (2012.01)
(Continued)

(52) U.S. Cl.
CPC ......... *F16D 48/06* (2013.01); *B60W 50/0205* (2013.01); *F16D 48/064* (2013.01);
(Continued)

(58) Field of Classification Search
CPC .. B60W 50/0205; F16D 48/06; F16D 48/064; F16D 48/10; F16D 2500/10431;
(Continued)

(56) References Cited

U.S. PATENT DOCUMENTS 5,089,804 A * 2/1992 Mimura ................ F16D 48/064
                                                340/438
5,806,621 A * 9/1998 Soda ................... B60L 11/1801
                                                180/206.2
(Continued)

FOREIGN PATENT DOCUMENTS

JP   H04-364316 A   12/1992
JP   H10-191551 A   7/1998
(Continued)

OTHER PUBLICATIONS

Extended European Search Report issued Oct. 29, 2014, in European Patent Application No. 14161414.9.
(Continued)

*Primary Examiner* — Jacob S Scott
*Assistant Examiner* — Tinh Dang
(74) *Attorney, Agent, or Firm* — Oblon, McClelland, Maier & Neustadt, L.L.P.

(57) ABSTRACT

A microcomputer of a driving force distribution control device detects a maximum current value among values of an upper current acquired during a predetermined period, and determines that an overcurrent abnormality has occurred in the driving force distribution control device when the maximum current value is equal to or larger than an abnormal current threshold value and a time, for which the maximum current value is equal to or larger than the abnormal current threshold value, is equal to or larger than an abnormality detection time. Then, the microcomputer performs off control to turn off a relay, and notifies a driver of occurrence of the overcurrent abnormality using a notification unit.

6 Claims, 7 Drawing Sheets

(51) Int. Cl.
*B60K 17/35* (2006.01)
*H03K 17/082* (2006.01)
*H02H 3/087* (2006.01)
*H02H 3/04* (2006.01)

(52) U.S. Cl.
CPC ........... *F16D 48/066* (2013.01); *H02H 3/087* (2013.01); *H03K 17/0822* (2013.01); *B60K 17/35* (2013.01); *B60W 2050/022* (2013.01); *B60Y 2400/4045* (2013.01); *F16D 2500/10431* (2013.01); *F16D 2500/3022* (2013.01); *F16D 2500/3115* (2013.01); *F16D 2500/5102* (2013.01); *F16D 2500/5104* (2013.01); *F16D 2500/5108* (2013.01); *F16D 2500/5114* (2013.01); *F16D 2500/525* (2013.01); *F16D 2500/70418* (2013.01); *F16D 2500/70615* (2013.01); *F16D 2500/7104* (2013.01); *F16D 2500/7109* (2013.01); *H02H 3/04* (2013.01)

(58) Field of Classification Search
CPC ....... F16D 2500/3022; F16D 2500/501; F16D 2500/5102; F16D 2500/70223; F16D 2500/70424; F16D 2500/1021
USPC ........................................................... 701/68
See application file for complete search history.

(56) References Cited

U.S. PATENT DOCUMENTS

| | | | |
|---|---|---|---|
| 5,839,537 A * | 11/1998 | Nishino | B62D 5/0466 180/443 |
| 7,006,899 B2 * | 2/2006 | Wakao | B60K 23/0808 180/248 |
| 7,038,895 B2 * | 5/2006 | Imai | H01H 47/002 361/23 |
| 2004/0044459 A1 | 3/2004 | Wakao et al. | |
| 2008/0002325 A1 | 1/2008 | Kato et al. | |
| 2009/0128106 A1 | 5/2009 | Takahashi et al. | |
| 2009/0273874 A1 | 11/2009 | Yen | |
| 2012/0140364 A1 * | 6/2012 | Kato | B60W 50/0205 361/23 |

FOREIGN PATENT DOCUMENTS

JP 2004-142726 5/2004
JP 2004-149113 A 5/2004

OTHER PUBLICATIONS

Notice of Reasons for the Rejection dated Dec. 20, 2016 in Japanese Patent Application No. 2013-066611 w/English translation.

* cited by examiner

ABNORMAL CURRENT THRESHOLD VALUE –
ABNORMALITY DETECTION TIME
THRESHOLD VALUE MAP M

ELECTRICAL LOAD CONTROL DEVICE, ABNORMALITY DETERMINATION METHOD, AND ABNORMALITY DETERMINATION PROGRAM

INCORPORATION BY REFERENCE

The disclosure of Japanese Patent Application No. 2013-066611 filed on Mar. 27, 2013 including the specification, drawings and abstract is incorporated herein by reference in its entirety.

BACKGROUND OF THE INVENTION

1. Field of the Invention

The invention relates to an electrical load control device including an overcurrent abnormality determination device, an overcurrent abnormality determination method for an electrical load control device, and an overcurrent abnormality determination program.

2. Description of Related Art

Generally, a driving force distribution device of a four-wheel drive vehicle directly transmits a driving force from a transmission to either front wheels or rear wheels and also distributes and transmits the driving force to the other of the front wheels and the rear wheels through a variable torque clutch mechanism. By adjusting the transmission torque using this mechanism, the distribution of the driving force to the front and rear wheels is adjusted. As the variable torque clutch mechanism, an electromagnetic variable torque clutch mechanism is known. The electromagnetic variable torque clutch mechanism is controlled by a driving force distribution control device (ECU). That is, the frictional engagement force between clutch discs is variably controlled to control the fastening force by controlling the value of a current supplied to an electromagnetic solenoid using the ECU. Thus, the transmission torque is controlled. More specifically, the ECU generates a current command value (the amount of the current to be supplied to the electromagnetic solenoid), and calculates a duty ratio to eliminate the deviation between the current command value and the actual current (detection current) flowing through the electromagnetic solenoid by using proportional and integral control (PI control) and Pulse Width Modulation (PWM) control. The ECU controls the electromagnetic solenoid by outputting a control signal corresponding to the duty ratio to the driving circuit.

When a short-circuit failure occurs between both ends of the electromagnetic solenoid, there is a possibility that a hunting phenomenon may occur. The hunting phenomenon refers to a phenomenon in which excessive current (actual current) flows when a field effect transistor (FET) of the driving circuit is turned on in a state where a short-circuit failure occurs between both ends of the electromagnetic solenoid. Since the ECU performs the PI control, the ECU performs control so that the current is reduced to zero or a current value near zero by reducing the duty ratio when an excessive actual current is detected. When the current becomes zero, the ECU performs control so that a current flows again. As a result, an excessive current flows.

A driving force distribution control device that determines whether or not there is a short circuit between both ends of an electromagnetic solenoid based on the detection of a hunting phenomenon is known (for example, refer to Japanese Patent Application Publication No. 2004-142726 (JP 2004-142726 A)). In this driving force distribution control device, it is determined whether or not there is a short circuit between both ends of an electromagnetic solenoid based on the number of times of hunting of a current command value with respect to a threshold value within a time shorter than a predetermined time. When it is determined that there is the current command value, a microcomputer of an ECU accumulates the number of times of hunting with respect to the threshold value within a time shorter than the predetermined time, and determines that both ends of the electromagnetic solenoid are short-circuited if the number of times of hunting is equal to or larger than the predetermined number of times.

In the driving force distribution control device (ECU) described in Japanese Patent Application Publication No. 2004-142726 (JP 2004-142726 A), however, even when it is determined that there is the current command value, it is not determined that both ends of the electromagnetic solenoid are short-circuited unless the number of times of hunting reaches the predetermined number of times. While the number of times of hunting is accumulated, an overcurrent due to a short circuit between both terminals of the electrical load continues to flow to the electrical load control device. In addition, since a current flowing between a battery as a power supply and the electromagnetic solenoid is a pulsed current, a plurality of current A/D values sampled during a predetermined period are averaged. Therefore, when the electromagnetic solenoid is actually short-circuited, the value of an overcurrent is calculated to be low. As a result, there is a possibility that the abnormality cannot be detected.

SUMMARY OF THE INVENTION

An object of the invention is to more quickly detect an overcurrent abnormality in an electrical load control device due to a short circuit between both terminals of an electrical load.

According to an aspect of the invention, there is provided an electrical load control device including an abnormality determination device. The electrical load control device calculates a duty ratio to eliminate a difference between a current command value indicating a current to be supplied to an electrical load and a current value that is an actually detected value of a current flowing through the electrical load, and the electrical load control device performs pulse width modulation control to control driving of the electrical load based on the duty ratio. The abnormality determination device includes a maximum current value detection unit that detects a maximum current value that is a largest current value among the current values; an abnormal current determination unit that determines whether or not there is an abnormal current based on a result of comparison between the detected maximum current value and an abnormal current threshold value; an abnormality detection time determination unit that determines whether or not a detection time, for which the abnormal current is detected, is equal to or larger than an abnormality detection time threshold value based on a result of comparison between the detection time and the abnormality detection time threshold value; and an abnormality determination unit that determines that there is an overcurrent abnormality when the maximum current value is equal to or larger than the abnormal current threshold value and the detection time is equal to or larger than the abnormality detection time threshold value.

With this configuration, the abnormality determination unit determines that there is the overcurrent abnormality when the maximum current value is equal to or larger than the abnormal current threshold value and the detection time is equal to or larger than the abnormality detection time threshold value. Thus, it is possible to determine whether or not there is the overcurrent abnormality in the electrical load control device due to a short circuit in the electrical load, based on the maximum current value that is the maximum value of the current flowing through the electrical load.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
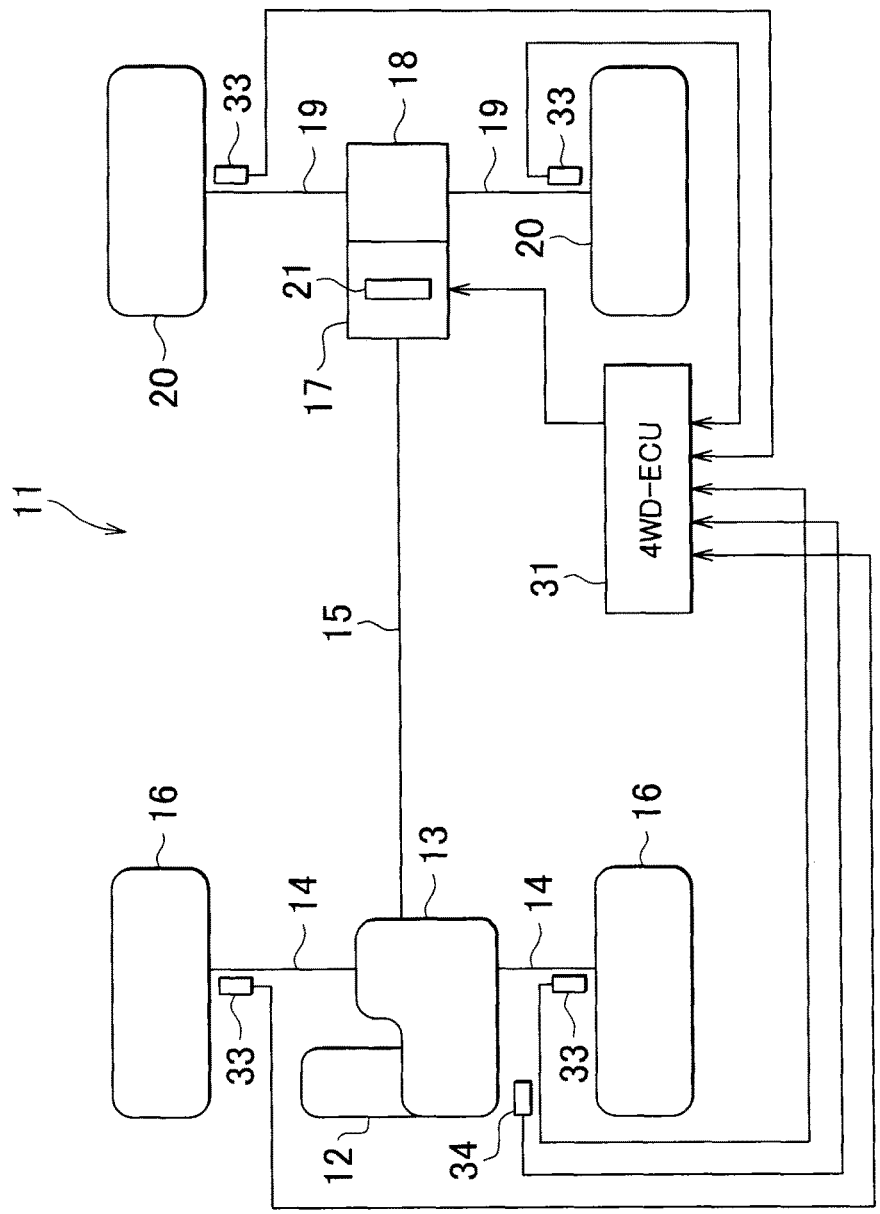
FIG. 1 is a schematic configuration diagram of a four-wheel drive vehicle according to an embodiment.

Hereinafter, an embodiment of a driving force distribution control device will be described. As shown in FIG. 1, a four-wheel drive vehicle 11 includes an engine 12 that constitutes a driving source and a transaxle 13. The transaxle 13 includes a transmission, a transfer, and the like. A pair of front axles 14, 14 and a propeller shaft 15 are connected to the transaxle 13. Front wheels 16, 16 are connected to the front axles 14, 14. A driving force transmission device 17 as a driving force distribution device is connected to the propeller shaft 15, and a rear differential 18 is connected to the driving force transmission device 17 through a drive pinion shaft (not shown). Rear wheels 20, 20 are connected to the rear differential 18 through a pair of rear axles 19, 19.

The driving force of the engine 12 is transmitted to the front wheels 16, 16 through the transaxle 13 and the front axles 14, 14. When the propeller shaft 15 and the drive pinion shaft are connected to each other through the driving force transmission device 17 so that the torque can be transmitted, the driving force of the engine 12 is transmitted to the rear wheels 20, 20 through the propeller shaft 15, the drive pinion shaft, the rear differential 18, and the rear axles 19, 19.

A driving force transmission system is constituted by the transaxle 13, the front axles 14, 14, the propeller shaft 15, the drive pinion shaft, the driving force transmission device 17, the rear differential 18, and the rear axles 19, 19.

The driving force transmission device 17 includes a wet multi-disc type electromagnetic clutch mechanism 21, and the electromagnetic clutch mechanism 21 includes a plurality of clutch discs (not shown) that are frictionally engaged with each other or are spaced apart from each other. When a predetermined current is supplied to an electromagnetic solenoid 22 (refer to FIG. 2) as an electrical load provided in the electromagnetic clutch mechanism 21, the clutch discs are frictionally engaged with each other, and the torque (driving force) is transmitted between the front wheels 16, 16 and the rear wheels 20, 20. When the supply of the current to the electromagnetic clutch mechanism 21 is stopped, the clutch discs are spaced apart from each other, and the transmission of torque between the front wheels 16, 16 and the rear wheels 20, 20 is also stopped.

The frictional engagement force between the clutch discs increases or decreases according to the amount (intensity) of the current supplied to the electromagnetic solenoid 22. By controlling the amount of the current supplied to the electromagnetic solenoid 22, transmission torque between the front wheels 16, 16 and the rear wheels 20, 20 can be arbitrarily adjusted. Transmission force between the front wheels 16, 16 and the rear wheels 20, 20 increases with an increase in the frictional engagement force between the clutch discs. On the other hand, the transmission force between the front wheels 16, 16 and the rear wheels 20, 20 decreases with a decrease in the frictional engagement force between the clutch discs.

The supply of the current to the electromagnetic solenoid 22, the stopping of the supply of the current to the electromagnetic solenoid 22, and the adjustment of the amount of supplied current are controlled by a driving force distribution control device 31 (4WD-ECU) that is an electronic control device for driving force distribution. The driving force distribution control device 31 selects either a four-wheel drive state or a two-wheel drive state, and controls the driving force distribution ratio (torque distribution ratio) between the front wheels 16, 16 and the rear wheels 20, 20 in the four-wheel drive state, by controlling the frictional engagement force between the clutch discs in the electromagnetic clutch mechanism 21.

Figure 2:
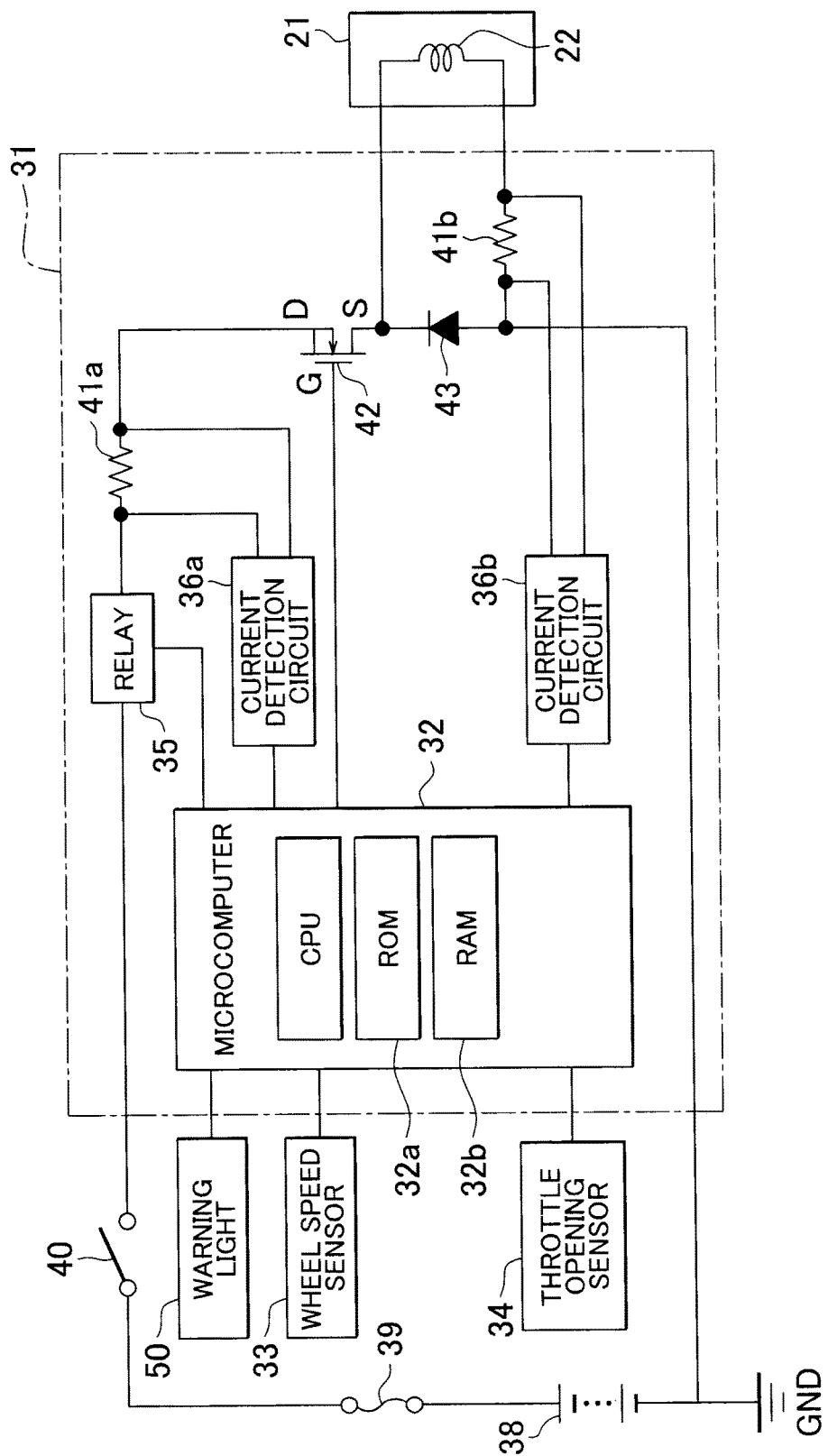
FIG. 2 is a circuit diagram showing an electrical configuration of a driving force distribution control device according to the embodiment.

The electrical configuration of the driving force distribution control device 31 of the four-wheel drive vehicle 11 will be described with reference to FIG. 2. As shown in FIG. 2, the driving force distribution control device 31 of the four-wheel drive vehicle 11 is configured to include, as a main component, a microcomputer 32 including a central processing unit (CPU), a read only memory (ROM) 32a and a random access memory (RAM) 32b that constitute a storage unit, an input interface, and the like. The microcomputer 32 corresponds to an abnormality determination unit.

Various programs executed by the microcomputer 32, various data, and various characteristic maps are stored in the ROM 32a. The various characteristic maps are obtained in advance based on experimental data obtained by using a vehicle model, known theoretical calculated values, and the like. The RAM 32b is a work area in which various control programs written in the ROM 32a are loaded so that the CPU of the driving force distribution control device 31 executes various kinds of arithmetic processing (for example, arithmetic processing for controlling the supply of the current to the electromagnetic solenoid 22).

Wheel speed sensors 33, a throttle opening sensor 34, a relay 35, current detection circuits 36a, 36b, an engine control device (not shown), and a warning light 50 are connected to the microcomputer 32 through an input/output interface (not shown).

The wheel speed sensors 33 are provided for the right and left front wheels 16, 16 and the right and left rear wheels 20, 20, respectively. A total of four wheel speed sensors 33 detect the wheel speeds of the front wheels 16, 16 and the rear wheels 20, 20 separately, and transmit the detection results (wheel speed signals) to the microcomputer 32. The wheel speed is the rotation speed that is the number of revolutions of the wheel per unit time.

The throttle opening sensor 34 is connected to a throttle valve (not shown), and detects the opening degree of the throttle valve (throttle opening), that is, the amount of depressing operation of an accelerator pedal (not shown) depressed by the driver. The throttle opening sensor transmits the detection result (depressing operation amount signal) to the microcomputer 32.

The warning light 50 is turned on according to the control of the microcomputer 32. The warning light 50 corresponds to a notification unit. The four-wheel drive vehicle 11 includes a battery 38. A series circuit of a fuse 39, an ignition switch 40, the relay 35, a shunt resistor 41a, a field effect transistor (hereinafter, referred to as a FET 42), the electromagnetic solenoid 22, and a shunt resistor 41b is connected to both ends of the battery 38.

Both ends of the shunt resistor 41a are connected to the input side of the current detection circuit 36a, and both ends of the shunt resistor 41b are connected to the input side of the current detection circuit 36b. The current detection circuit 36a detects a current flowing through the shunt resistor 41a based on a voltage between both ends of the shunt resistor 41a and the current detection circuit 36b detects a current flowing through the shunt resistor 41b based on a voltage between both ends of the shunt resistor 41b, and the current detection circuits 36a, 36b transmit these detection results to the microcomputer 32. The microcomputer 32 calculates a current flowing through the electromagnetic solenoid 22 based on the actual current flowing through the shunt resistor 41a, which is transmitted from the current detection circuit 36a. A flywheel diode 43 is connected to both ends of the electromagnetic solenoid 22. The flywheel diode 43 is provided to eliminate the back electromotive force generated when the FET 42 is turned off, and the FET 42 is protected by the flywheel diode 43. A gate G of the FET 42 is connected to the output side of the microcomputer 32. A source S of the FET 42 is connected to the positive terminal of the electromagnetic solenoid 22, and a drain D of the FET 42 is connected to the shunt resistor 41a.

When the ignition switch 40 is turned on (closed), electric power is supplied from the battery 38 as a power supply to the microcomputer 32 through a power supply circuit (not shown). The microcomputer 32 calculates the amount of the current to be supplied to the electromagnetic solenoid 22 (current command value) by executing various control programs, such as a driving force distribution control program, based on various kinds of information (detection signals) obtained from the wheel speed sensor 33 and the throttle opening sensor 34.

More specifically, the microcomputer 32 generates (sets) the current command value for the electromagnetic solenoid 22 based on various kinds of information (detection signals) obtained from the wheel speed sensors 33 and the throttle opening sensor 34. The microcomputer 32 calculates a PI control value by using PI control in order to eliminate the deviation between the current command value and the actual current flowing through the electromagnetic solenoid 22. The microcomputer 32 determines a duty ratio by performing the PWM calculation according to the calculated PI control value, and performs ON/OFF control (PWM control) for the FET 42 so that a voltage controlled based on the duty ratio is applied to the electromagnetic solenoid 22. The microcomputer 32 variably controls the driving force distribution between the front wheel side and the rear wheel side by controlling the voltage applied to the electromagnetic solenoid 22.

When the ignition switch 40 is turned off (opened), the supply of electric power to the microcomputer 32 is stopped. When an overcurrent abnormality to be described later is detected, the microcomputer 32 notifies the user of occurrence of the overcurrent abnormality in the driving force distribution control device 31 functioning as an electrical load control device, by turning on the warning light 50.

Figure 3:
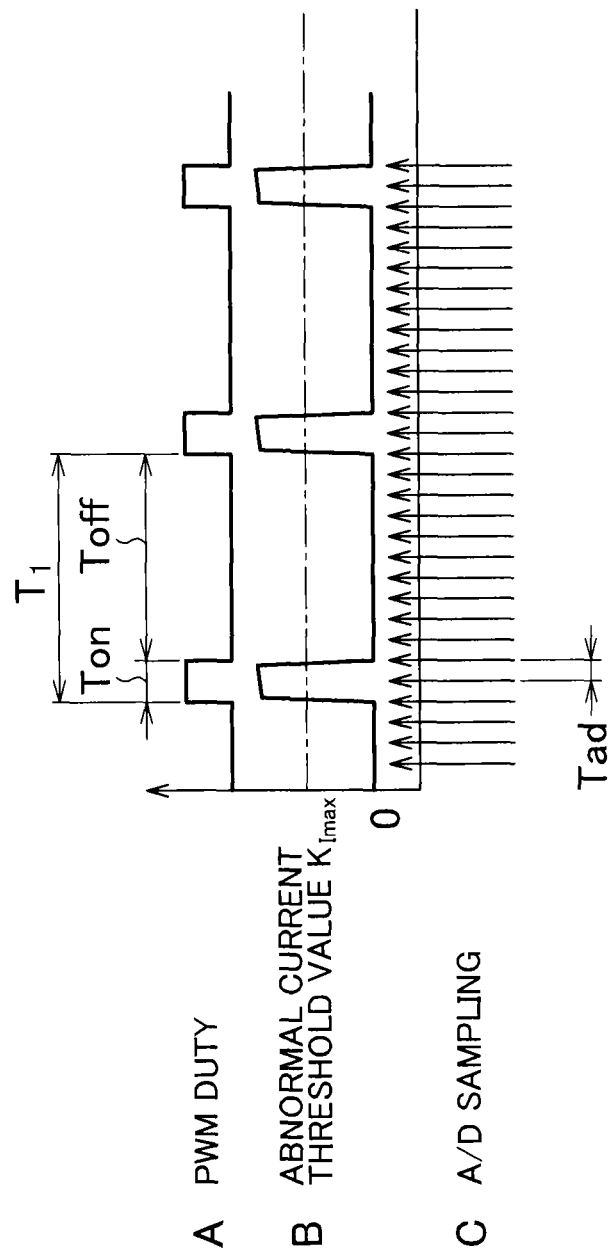
FIG. 3 is a diagram including a graph A that is an explanatory diagram showing a correlation between a duty ratio and a time, a graph B that is an explanatory diagram showing a change in a current flowing between a battery and an electromagnetic solenoid with respect to a time axis of the graph A, and a graph C that is a timing chart showing A/D sampling with respect to the time axis of the graph A.

Next, the overcurrent abnormality determination process executed by the microcomputer 32 will be described in detail with reference to FIG. 3 and flowcharts shown in FIGS. 4 to 6. The flowcharts are executed based on various control programs stored in advance in the ROM 32a. Hereinafter, a step will be abbreviated as S.

First, a process of acquiring the upper current (precisely, the actual current flowing through the shunt resistor 41a) executed by the microcomputer 32 will be described. As shown in FIG. 3 where the period for which the duty is ON is a period Ton and the period for which the duty is OFF is a period Toff, the microcomputer 32 acquires the upper current through the current detection circuit 36a during the period Ton. A period Tad for A/D sampling is a period shorter than the period Ton. Accordingly, it is possible to acquire the upper current in every period Ton for which the duty is ON.

Figure 4:
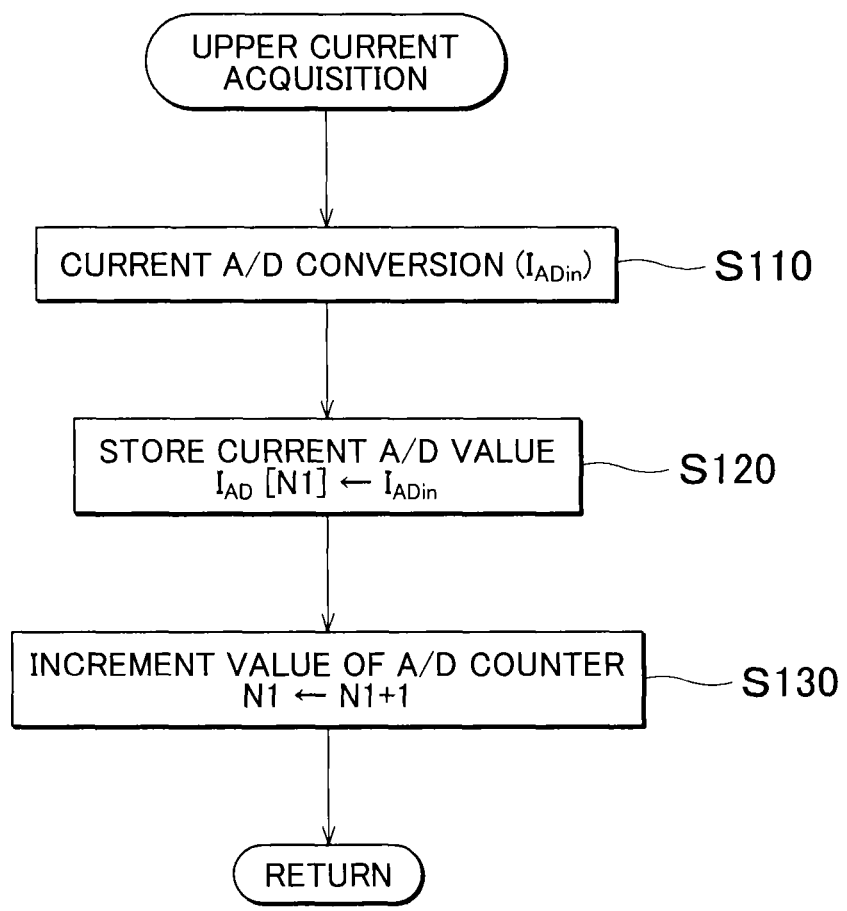
FIG. 4 is a flowchart showing a flow of an upper current acquisition process in the embodiment.

As shown in FIG. 4, in S110, the microcomputer 32 performs A/D ($I_{ADin}$) conversion of the upper current acquired through the current detection circuit 36a. Then, the process proceeds to S120. In S120, the microcomputer 32 stores the current A/D value in a predetermined region $I_{AD}$ [N1] of the RAM 32b. Then, the process proceeds to S130.

In S130, the microcomputer 32 increments the value of an A/D counter N1 (N1←N1+1). Then, the process ends. The increment refers to increasing the value of the A/D counter N1 by 1, for example.

The microcomputer 32 acquires the upper current every predetermined period Ton, and stores the acquired upper current in the predetermined region $I_{AD}$ [N1] of the RAM 32b. Next, the overcurrent abnormality determination process executed by the microcomputer 32 will be described with reference to the flowchart shown in FIG. 5.

Figure 5:
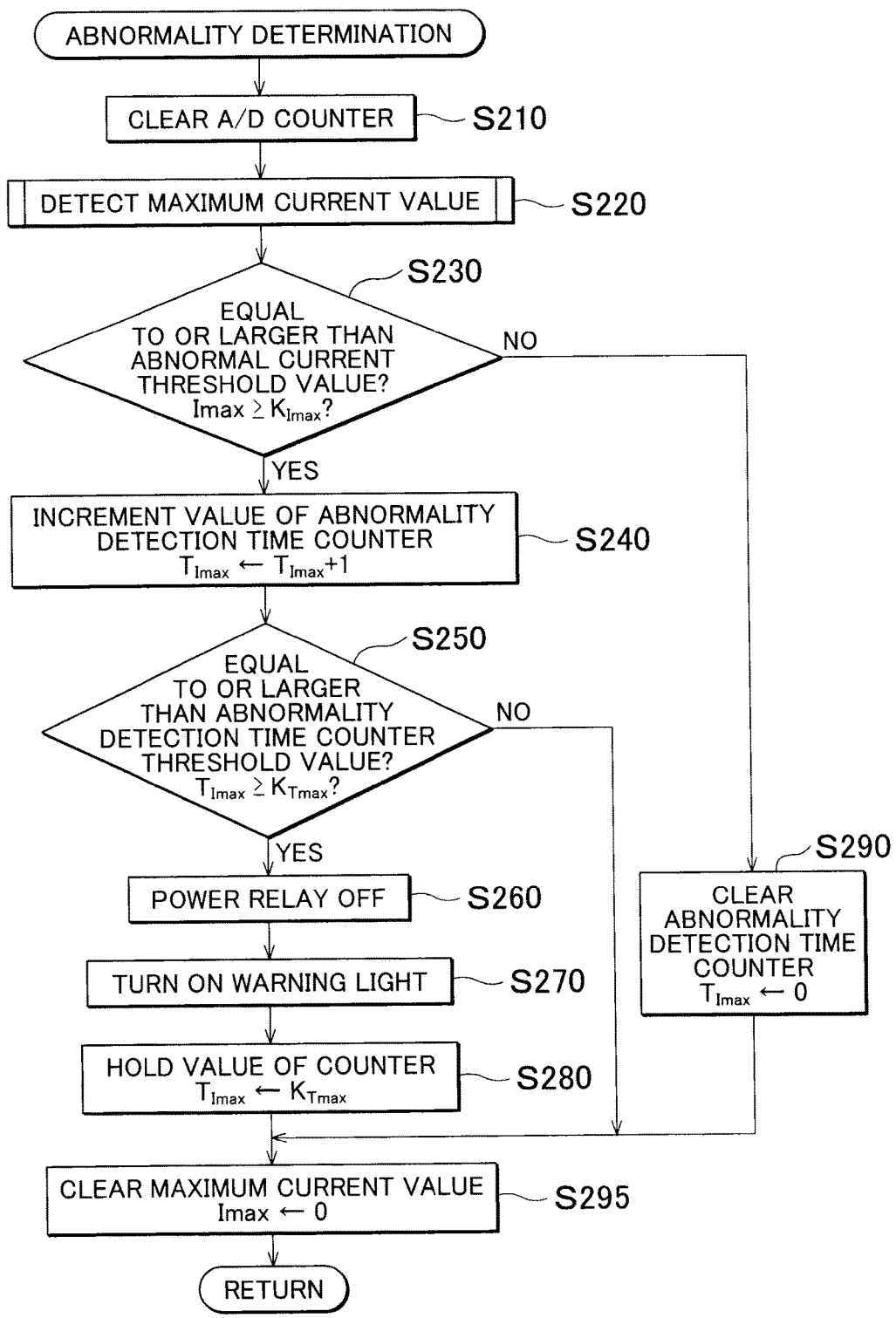
FIG. 5 is a flowchart showing a flow of an abnormality determination process in the embodiment.
Figure 6:
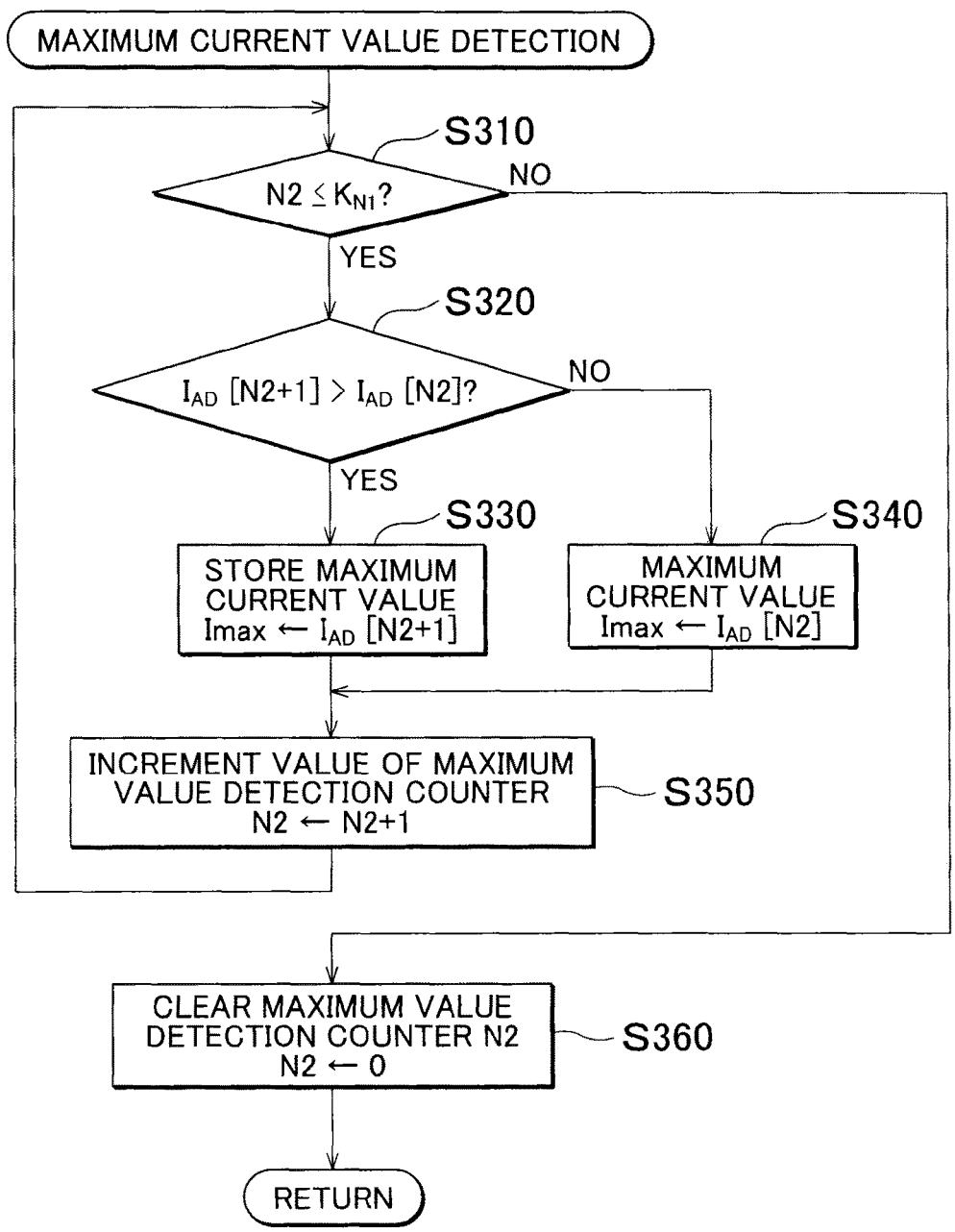
FIG. 6 is a flowchart showing a flow of a maximum current value detection process in the embodiment.

As shown in FIG. 5, in S210, the microcomputer 32 clears the cumulative value of the A/D counter N1 (N1←0). Then, the process proceeds to S220. In S220, the microcomputer 32 detects a maximum current value that is the largest value among the values of the upper current acquired during the period T1. Then, the process proceeds to S230.

In S230, the microcomputer 32 determines whether or not there is an overcurrent abnormality by comparing the maximum current value detected in S220 with an abnormal current threshold value $K_{Imax}$. More specifically, when the microcomputer 32 determines that the detected maximum current value is equal to or larger than the abnormal current threshold value $K_{Imax}$ (S230: YES), the process proceeds to S240. On the other hand, when the microcomputer 32 determines that the maximum current value is smaller than the abnormal current threshold value $K_{Imax}$ (S230: NO), the process proceeds to S290. In S290, the microcomputer 32 clears the value of an abnormality detection time counter $T_{Imax}$ ($T_{Imax}$←0). Then, the process proceeds to S295. S230 corresponds to an abnormal current determination step. The abnormal current threshold value $K_{Imax}$ is set to a value lower than a detection current detected when the duty ratio is set to, for example, X % in a state where both terminals of the electromagnetic solenoid 22 are short-circuited.

Therefore, it is possible to determine whether or not the detection current is an abnormal current by comparing the detection current with the abnormal current threshold value $K_{Imax}$. The abnormal current threshold value $K_{Imax}$ is determined in advance by a test and the like, and is stored in the ROM 32a.

In S240, the microcomputer 32 increments the value of the abnormality detection time counter $T_{Imax}$ ($T_{Imax} \leftarrow T_{Imax} + 1$). Then, the process executed by the microcomputer 32 proceeds to S250.

In S250, the microcomputer 32 determines whether or not the detection time (the number of times an abnormal current is detected), for which an abnormal current is detected, is equal to or larger than an abnormality detection time. More specifically, when the value of the abnormality detection time counter $T_{Imax}$ is equal to or larger than the abnormality detection time counter threshold value $K_{Tmax}$ (S250:YES), the process executed by the microcomputer 32 proceeds to S260. On the other hand, when the value of the abnormality detection time counter $T_{Imax}$ is smaller than the abnormality detection time counter threshold value $K_{Tmax}$ that is a reference value used for determining whether or not there is an abnormality (S250: NO), the process executed by the microcomputer 32 proceeds to S295.

The abnormality detection time counter threshold value $K_{Tmax}$ is the number of times an abnormal current is detected. Therefore, the detection time, for which an abnormality is detected, is determined by multiplying the value of the abnormality detection time counter $T_{Imax}$ by the period of the overcurrent abnormality determination process. Similarly, the abnormality detection time, which is a reference used for determining whether or not the detection time is abnormal, is determined by multiplying the abnormality detection time counter threshold value $K_{Tmax}$ by the period of the overcurrent abnormality determination process. Therefore, it is possible to determine whether or not the abnormality detection time has passed (the detection time is equal to or larger than the abnormality detection time), by comparing the value of the abnormality detection time counter $T_{Imax}$ with the abnormality detection time counter threshold value $K_{Tmax}$.

The abnormality detection time counter threshold value $K_{Tmax}$ is determined by a test and the like, and is stored in the ROM 32a. S250 corresponds to an abnormality detection time determination step. The abnormality detection time counter threshold value $K_{Tmax}$ corresponds to an abnormality detection time threshold value.

In S260, the microcomputer 32 performs off control to turn off the relay 35. That is, when it is determined that the detected maximum current value is equal to or larger than the abnormal current threshold value $K_{Imax}$ and the detection time is equal to or larger than the abnormality detection time, the supply of electric power to the electromagnetic solenoid 22 is stopped by performing the off control to turn off the relay 35.

In S270, when the microcomputer 32 determines that there is an overcurrent abnormality, the microcomputer 32 notifies the driver of occurrence of the overcurrent abnormality in the driving force distribution control device 31 by turning on the warning light 50. In S280, the microcomputer 32 holds the value of the abnormality detection time counter $T_{Imax}$ ($T_{Imax} \leftarrow K_{Tmax}$). Then, the process proceeds to S295.

In S295, the microcomputer 32 clears the maximum current value stored in a predetermined region Imax (Imax←0), and the processing of the flowchart is ended. The microcomputer 32 functions as an abnormality determination device. In this case, the microcomputer 32 functions as a maximum current value detection unit that executes the process of S220, an abnormal current determination unit that executes the process of S230, and an abnormality detection time determination unit that executes the process of S250.

Next, a process of detecting the maximum value among the current A/D values acquired by the upper current acquisition process executed by the microcomputer 32 will be described with reference to the flowchart shown in FIG. 6. As shown in FIG. 6, in S310, the microcomputer 32 determines whether or not the value of a maximum value detection counter N2 is equal to or smaller than a maximum value detection counter threshold value $K_{N1}$. The maximum value detection counter threshold value $K_{N1}$ is the number of times the current A/D value is acquired during the period T1. For example, as shown in FIG. 3, in a case where the current A/D value is acquired twice during the period T1, $K_{N1}$ is 2.

When the value of the maximum value detection counter N2 is equal to or smaller than the maximum current value detection counter threshold value $K_{N1}$ (S310: YES), the process proceeds to S320. In S320, the microcomputer 32 compares the current A/D values acquired by the upper current acquisition process. For example, when the current A/D value stored in a predetermined region $I_{AD}$ [N2+1] of the RAM 32b is larger than the current A/D value stored in a predetermined region $I_{AD}$ [N2] (S320: YES), the process executed by the microcomputer 32 proceeds to S330. On the other hand, when the current A/D value stored in the predetermined region $I_{AD}$ [N2+1] is equal to or smaller than the current A/D value stored in the predetermined region $I_{AD}$ [N2] (S320: NO), the process proceeds to S340.

In S330, the microcomputer 32 stores the current A/D value, which is stored in the predetermined region $I_{AD}$ [N2+1], in the predetermined region Imax of the RAM 32b. Then, the process proceeds to S350. In S340, the microcomputer 32 stores the current A/D value, which is stored in the predetermined region $I_{AD}$ [N2], in the predetermined region Imax of the RAM 32b. Then, the process proceeds to S350.

In S350, the microcomputer 32 increments the value of the maximum value detection counter N2 (N2←N2+1). Then, the process proceeds to S310. In S310, when the value of the maximum value detection counter N2 exceeds the maximum value detection counter threshold value $K_{N1}$ (S310: NO), the process proceeds to S360.

In S360, the microcomputer 32 clears the value of the maximum value detection counter N2 (N2←0), and the program processing is ended. Thus, when the upper current acquired during the predetermined period T1 is equal to or larger than the abnormal current threshold value (S230) and the abnormality detection time has passed (the detection time is equal to or larger than the abnormality detection time) (S250), the microcomputer 32 determines that there is an overcurrent abnormality in the driving force distribution control device 31 due to a short circuit between both terminals of the electromagnetic solenoid 22. Therefore, it is possible to quickly detect the overcurrent abnormality in the driving force distribution control device 31 due to a short circuit between both terminals of the electromagnetic solenoid 22, as compared to a known driving force distribution control device that determines whether or not there is an overcurrent abnormality based on the average value of the acquired current values, for example. Further, it is possible to prevent damage to an element provided between the battery 38 and the electromagnetic solenoid 22.

The microcomputer 32 changes the driving mode of the four-wheel drive vehicle 11 from the four-wheel drive mode (4WD) to the two-wheel drive mode (2WD) when an overcurrent abnormality occurs in the driving force distribution control device 31, that is, when both terminals of the electromagnetic solenoid 22 are short-circuited. Accordingly, even if an overcurrent abnormality occurs in the driving force distribution control device 31, the four-wheel drive vehicle 11 can travel.

According to the embodiment described above, the following effects can be obtained. In the driving force distribution control device 31, the microcomputer 32 is provided as a device that determines whether or not there is an abnormality in the electromagnetic solenoid 22. The microcomputer 32 detects the maximum current value among the values of the upper current (actual current flowing through the shunt resistor 41a) acquired during the predetermined period T1, and determines that an overcurrent abnormality has occurred in the driving force distribution control device 31 when the maximum current value is equal to or larger than the abnormal current threshold value $K_{Imax}$ and the detection time, for which the maximum current value is equal to or larger than the abnormal current threshold value $K_{Imax}$, is equal to or larger than the abnormality detection time. Thus, it is possible to quickly detect the overcurrent abnormality in the driving force distribution control device 31 due to a short circuit between both terminals of the electromagnetic solenoid 22, as compared to a known driving force distribution control device that determines whether or not there is an overcurrent abnormality based on the average value of the acquired current values, for example. Unless the abnormality detection time has passed (the detection time, for which the maximum current value is equal to or larger than the abnormal current threshold value $K_{Imax}$, is equal to or larger than the abnormality detection time), it is not determined that there is an overcurrent abnormality. Therefore, it is also possible to suppress erroneous detection of an overcurrent abnormality in the driving force distribution control device 31.

The microcomputer 32 performs the off control to turn off the relay 35 when it is determined that there is an overcurrent abnormality. Therefore, when it is determined that there is an overcurrent abnormality, it is possible to stop the supply of electric power to the electromagnetic solenoid 22. Accordingly, it is possible to prevent damage to an element, in particular, an element present between the battery 38 and the electromagnetic solenoid 22 due to the overcurrent abnormality in the driving force distribution control device 31.

When it is determined that there is an overcurrent abnormality in the driving force distribution control device 31, the microcomputer 32 notifies the driver of occurrence of the overcurrent abnormality in the driving force distribution control device 31 by turning on the warning light 50. Thus, it is possible to draw attention of the driver to the overcurrent abnormality in the driving force distribution control device 31.

Figure 7:
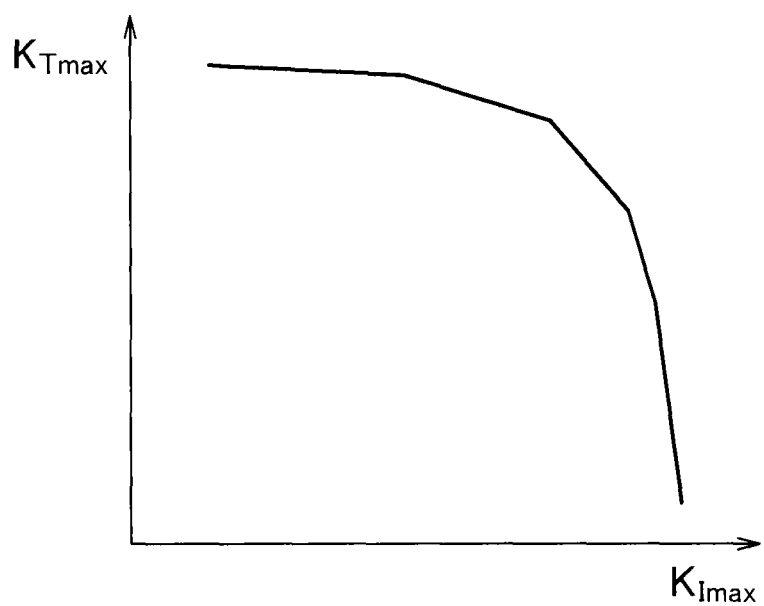
FIG. 7 is a map showing a correlation between an abnormal current threshold value and an abnormality detection time in another embodiment.

The invention can be implemented in the following modified examples obtained by appropriately modifying the embodiment described above. The abnormality detection time counter threshold value $K_{Tmax}$ in an example may be set according to the abnormal current threshold value $K_{Imax}$. In this case, a map M is stored in the ROM 32a. As shown in FIG. 7, the map M shows the correlation between the abnormal current threshold value $K_{Imax}$ and the abnormality detection time counter threshold value $K_{Tmax}$. On the basis of the map, the microcomputer 32 sets the abnormality detection time counter threshold value $K_{Tmax}$ according to the abnormal current threshold value $K_{Imax}$. That is, when the abnormal current threshold value $K_{Imax}$ is large, the abnormality detection time counter threshold value $K_{Tmax}$ is set to be short. This process is executed, for example, every time the state of the ignition switch 40 is changed from the OFF state to the ON state. The overcurrent abnormality in the driving force distribution control device 31 can be more quickly detected by setting the abnormality detection time counter threshold value $K_{Tmax}$ according to the detected maximum current value.

The maximum value detection counter threshold value $K_{N1}$ acquired during the period T1 may be appropriately changed. For example, the maximum value detection counter threshold value $K_{N1}$ may be set to 1. When the maximum value detection counter threshold value $K_{N1}$ is 1, it is possible to set the value of the current, which actually flows through the shunt resistor 41a, as the maximum current value and determine whether or not there is an overcurrent abnormality in the driving force distribution control device 31 based on the abnormality determination program in this example.

The abnormality detection time counter threshold value $K_{Tmax}$ may be appropriately changed. For example, the abnormality detection time counter threshold value $K_{Tmax}$ may be set to 1 or more. For example, if the abnormality detection time counter threshold value $K_{Tmax}$ is 1, the microcomputer 32 determines that an overcurrent abnormality has occurred in the driving force distribution control device 31 when an abnormal current is detected once. Also in this case, it is possible to determine whether or not there is an overcurrent abnormality in the driving force distribution control device 31.

Although an electrical load control device and an abnormality determination device are embodied as the driving force distribution control device 31 in the present embodiment, the electrical load control device and the abnormality determination device are not limited to this device. For example, the electrical load control device and the abnormality determination device are embodied as a motor control device that controls an electric motor as an electrical load. In this case, it is possible to determine whether or not there is an abnormality in the motor control device due to an overcurrent that is caused by a short circuit between both terminals of the coil of the motor.

Although the warning light 50 is provided as a notification unit in the present embodiment, a speaker that generates a warning sound or a warning sound generator that generates a warning message through a synthetic sound circuit or the like may be provided as a notification unit.

What is claimed is:
1. An abnormality determination method for controlling a supply of electrical power to an electrical load by determining whether or not there is an abnormality in an electrical load control device that calculates a duty ratio to eliminate a difference between a current command value indicating a current to be supplied to the electrical load and a current value that is an actually detected value of a current flowing through the electrical load, and performs pulse width modulation (PWM) control to control driving of the electrical load based on the duty ratio, comprising:
   making a determination that there is an overcurrent abnormality, when a maximum current value, which is a largest current value among the current values sampled in a PWM duty cycle at timings based on the duty ratio, is equal to or larger than an abnormal current threshold value, and a detection time for which an abnormal current is detected in the PWM duty cycle, is equal to or larger than an abnormality detection time threshold value; and shutting off the supply of electrical power to the electrical load when the determination is made that there is an overcurrent abnormality, wherein the electrical load is a driving force distribution device that adjusts a ratio between driving forces transmitted from a driving source of a vehicle to a plurality of wheels through a driving force transmission system.

2. An electrical load control device for an electrical load, the electrical load control device comprising an abnormality determination device, wherein the electrical load control device comprises a processor that calculates a duty ratio to eliminate a difference between a current command value indicating a current to be supplied to the electrical load and a current value that is an actually detected value of a current flowing through the electrical load, and the electrical load control device performs pulse width modulation (PWM) control to control driving of the electrical load based on the duty ratio, and wherein the abnormality determination device includes:

a maximum current value detection unit of the processor that detects a maximum current value that is a largest current value among the current values in a PWM duty cycle;

an abnormal current determination unit of the processor that determines whether or not there is an abnormal current based on a result of comparison between the detected maximum current value and an abnormal current threshold value;

an abnormality detection time determination unit of the processor that determines whether or not a detection time for which the abnormal current is detected in the PWM duty cycle, is equal to or larger than an abnormality detection time threshold value based on a result of comparison between the detection time and the abnormality detection time threshold value;

an abnormality determination unit of the processor that determines that there is an overcurrent abnormality when the maximum current value is equal to or larger than the abnormal current threshold value and the detection time is equal to or larger than the abnormality detection time threshold value; and a power off unit of the processor that shuts off the supply of electrical power to the electrical load when a determination is made that there is an overcurrent abnormality, wherein the electrical load is a driving force distribution device that adjusts a ratio between driving forces transmitted from a driving source of a vehicle to a plurality of wheels through a driving force transmission system.

3. The electrical load control device according to claim 2, wherein the electrical load is connected to a power supply through a relay in the abnormality determination device, and the abnormality determination unit performs off control to turn off the relay when the abnormality determination unit determines that there is the overcurrent abnormality in the electrical load control device.

4. The electrical load control device according to claim 2, wherein the abnormality determination device includes a notification unit of the processor that provides a notification that there is the overcurrent abnormality when the abnormality determination unit determines that there is the overcurrent abnormality.

5. The electrical load control device according to claim 2,
wherein the electrical load control device stores a correlation between the maximum current value and the abnormality detection time threshold value, and
the abnormality determination unit sets the abnormality detection time threshold value based on the detected maximum current value and the stored correlation.

6. An abnormality determination program for controlling a supply of electrical power to an electrical load by determining whether or not there is an abnormality in an electrical load control device that calculates a duty ratio to eliminate a difference between a current command value indicating a current to be supplied to the electrical load and a current value that is an actually detected value of a current flowing through the electrical load, and performs pulse width modulation (PWM) control to control driving of the electrical load based on the duty ratio, the abnormality determination program comprising:

a maximum current value detection step of detecting a maximum current value that is a largest current value among the current values sampled at timings based on the duty ratio in a PWM duty cycle;

an abnormal current determination step of determining whether or not there is an abnormal current based on a result of comparison between the detected maximum current value and an abnormal current threshold value; and an abnormality detection time determination step of determining whether or not a detection time for which the abnormal current is detected in the PWM duty cycle, is equal to or larger than an abnormality detection time threshold value based on a result of comparison between the detection time and the abnormality detection time threshold value, an overcurrent abnormality determining step of determining an overcurrent abnormality based on a determination result in each of the abnormal current determination step and the abnormality detection time determination step; and an electrical power supply shutting off step of shutting off power to the electrical load when the determination is made that there is an overcurrent abnormality, wherein the electrical load is a driving force distribution device that adjusts a ratio between driving forces transmitted from a driving source of a vehicle to a plurality of wheels through a driving force transmission system.

* * * * *